(12) United States Patent
Yahata et al.

(10) Patent No.: US 10,541,170 B2
(45) Date of Patent: Jan. 21, 2020

(54) SUBSTRATE PROCESSING APPARATUS AND METHOD OF MANUFACTURING SEMICONDUCTOR DEVICE

(71) Applicant: KOKUSAI ELECTRIC CORPORATION, Tokyo (JP)

(72) Inventors: Takashi Yahata, Toyama (JP); Naofumi Ohashi, Toyama (JP); Shun Matsui, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/352,119

(22) Filed: Mar. 13, 2019

(65) Prior Publication Data
US 2019/0287843 A1    Sep. 19, 2019

(30) Foreign Application Priority Data
Mar. 14, 2018 (JP) .................... 2018-047206

(51) Int. Cl.
| | | |
|---|---|---|
| *H01L 21/687* | (2006.01) | |
| *C23C 16/40* | (2006.01) | |
| *C23C 16/455* | (2006.01) | |
| *C23C 16/44* | (2006.01) | |

(Continued)

(52) U.S. Cl.
CPC ...... *H01L 21/68742* (2013.01); *C23C 16/405* (2013.01); *C23C 16/4412* (2013.01); *C23C 16/45563* (2013.01); *H01J 37/32357* (2013.01); *H01J 37/32449* (2013.01);

(Continued)

(58) Field of Classification Search
CPC .......... H01L 21/68742; H01L 21/0228; C23C 16/405
See application file for complete search history.

(56) References Cited

U.S. PATENT DOCUMENTS

| | | | | |
|---|---|---|---|---|
| 4,960,488 A | * | 10/1990 | Law ...................... | C23C 16/402 438/694 |
| 5,271,972 A | * | 12/1993 | Kwok .................. | C23C 16/402 257/E21.279 |

(Continued)

FOREIGN PATENT DOCUMENTS

| | | | | |
|---|---|---|---|---|
| JP | H03-281780 A | * | 12/1991 | ............. C23C 16/44 |
| JP | H03-281780 A | | 12/1991 | |

(Continued)

OTHER PUBLICATIONS

Jul. 15, 2019 Office Action issued in Taiwanese Patent Application No. 107147641.

(Continued)

*Primary Examiner* — Nathan W Ha
(74) *Attorney, Agent, or Firm* — Oliff PLC

(57) ABSTRACT

There is provided a technique, including: a process chamber in which a substrate is processed; a substrate support member configured to support the substrate; an elevator configured to elevate the substrate support member; a gas supply port configured to supply a gas to the substrate; and a controller configured to control an elevating operation of the elevator so as to differentiate an interval between the gas supply port and the substrate supported by the substrate support member, when a gas is supplied from the gas supply port.

20 Claims, 6 Drawing Sheets

(51) Int. Cl.
*H01L 21/02* (2006.01)
*H01J 37/32* (2006.01)

(52) U.S. Cl.
CPC .... *H01J 37/32834* (2013.01); *H01L 21/0228* (2013.01); *H01L 21/02274* (2013.01); *H01J 2237/3321* (2013.01)

(56) References Cited

U.S. PATENT DOCUMENTS

| | | | | |
|---|---|---|---|---|
| 5,275,977 | A * | 1/1994 | Otsubo | H01L 21/02164 257/E21.243 |
| 5,279,865 | A * | 1/1994 | Chebi | C23C 16/402 257/E21.278 |
| 5,399,387 | A | 3/1995 | Law et al. | |
| 8,921,234 | B2 * | 12/2014 | Liu | H01L 21/32136 156/345.13 |
| 8,980,763 | B2 * | 3/2015 | Wang | H01L 21/32136 216/37 |
| 9,309,598 | B2 * | 4/2016 | Wang | C23F 1/12 |
| 10,043,674 | B1 * | 8/2018 | Korolik | H01L 21/3065 |
| 2007/0116888 | A1 | 5/2007 | Faguet | |
| 2012/0231628 | A1 * | 9/2012 | Lee | C23C 16/44 438/694 |
| 2014/0000843 | A1 * | 1/2014 | Dunn | H01L 21/67109 165/80.2 |
| 2014/0273487 | A1 * | 9/2014 | Deshmukh | H01J 37/32715 438/714 |
| 2014/0367377 | A1 * | 12/2014 | Monden | H01L 21/67115 219/747 |
| 2015/0064809 | A1 * | 3/2015 | Lubomirsky | H01L 21/68742 438/5 |
| 2015/0194304 | A1 | 7/2015 | Hirochi et al. | |
| 2015/0214039 | A1 * | 7/2015 | Manna | H01L 21/02164 438/790 |
| 2015/0348823 | A1 * | 12/2015 | Chia | H01L 21/68742 269/296 |
| 2016/0197001 | A1 * | 7/2016 | Samir | C23C 16/44 118/623 |
| 2016/0319424 | A1 * | 11/2016 | Takahashi | C23C 16/4412 |
| 2017/0335459 | A1 * | 11/2017 | Choi | C23C 16/402 |
| 2017/0365449 | A1 * | 12/2017 | Cui | C23C 16/4586 |
| 2018/0096874 | A1 * | 4/2018 | Schaller | C23C 16/45565 |
| 2018/0155838 | A1 * | 6/2018 | Rasheed | H01L 21/67248 |
| 2018/0158671 | A1 * | 6/2018 | Suzuki | H01L 21/68742 |
| 2018/0174880 | A1 * | 6/2018 | Swaminathan | H01L 21/67017 |
| 2018/0197721 | A1 * | 7/2018 | Swaminathan | H01J 37/32522 |
| 2018/0218928 | A1 * | 8/2018 | Peh | H01L 21/67115 |
| 2018/0230598 | A1 * | 8/2018 | Tanaka | C23C 16/56 |
| 2018/0345330 | A1 * | 12/2018 | Zhai | B08B 7/0035 |
| 2018/0347037 | A1 * | 12/2018 | Zhai | C23C 16/4405 |
| 2018/0350644 | A1 * | 12/2018 | Matsuura | H01L 21/68742 |
| 2018/0350654 | A1 * | 12/2018 | Forderhase | H01L 21/68742 |
| 2019/0088518 | A1 * | 3/2019 | Koh | H01L 21/6833 |

FOREIGN PATENT DOCUMENTS

| | | | | |
|---|---|---|---|---|
| JP | 2007-138295 A | | 6/2007 | |
| JP | 2007138295 A | * | 6/2007 | ....... C23C 16/45525 |
| JP | 5872028 B2 | | 3/2016 | |

OTHER PUBLICATIONS

May 28, 2019 Office Action issued in Japanese Patent Application No. 2018-047206.

* cited by examiner

SUBSTRATE PROCESSING APPARATUS AND METHOD OF MANUFACTURING SEMICONDUCTOR DEVICE

BACKGROUND

Technical Field

This present disclosure relates to a substrate processing apparatus.

Description of Related Art

As an aspect of the substrate processing apparatus used in a manufacturing processing of a semiconductor device, for example, there is the substrate processing apparatus configured to perform a prescribed processing such as a film-forming processing by supplying various types of gases such as a source gas, a processing gas, or a purge gas, to a substrate such as a wafer.

SUMMARY

According to an aspect, there is provided a technique, including:
  a process chamber in which a substrate is processed;
  a substrate support member configured to support the substrate;
  an elevator configured to elevate the substrate support member;
  a gas supply port configured to supply a gas to the substrate; and
  a controller configured to control an elevating operation of the elevator so as to differentiate an interval between the gas supply port and the substrate supported by the substrate support member, when a gas is supplied from the gas supply port.

DETAILED DESCRIPTION

First Embodiment of this Present Disclosure

A first embodiment of this present disclosure will be described hereafter, with reference to drawings.

(1) Configuration of Substrate Processing Apparatus

First, a configuration of a substrate processing apparatus according to the first embodiment of this present disclosure will be described.

The substrate processing apparatus according to the present embodiment is used in a manufacturing processing of a semiconductor device, and is configured as a single-wafer-type substrate processing apparatus which performs processing one by one to a substrate to be processed.

For example, the substrate to be processed includes a semiconductor wafer substrate (hereafter, simply referred to as "wafer") on which a semiconductor integrated circuit device (semiconductor device) is mounted.

Further, processing performed using the substrate processing apparatus is oxidizing, diffusion processing, reflow or annealing for activating a carrier or for flattening after ion implantation, film-forming processing, or the like, for example. The present embodiment shows, for example, a case of performing particularly the film-forming processing.

A configuration of the substrate processing apparatus according to the present embodiment will be described hereafter, with reference to FIG. 1.

Figure 1:
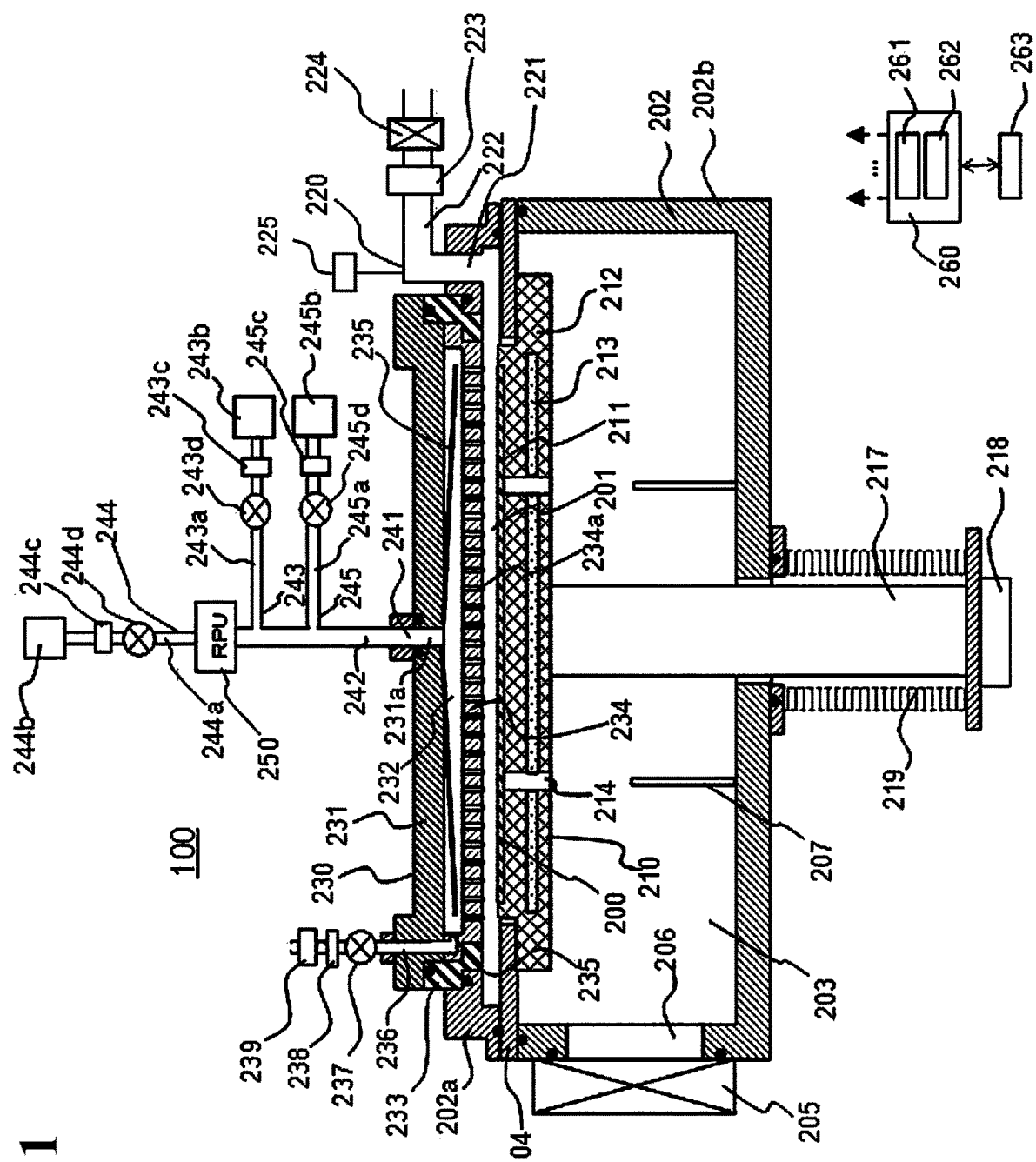
FIG. 1 is an explanation view showing schematically a configuration example of a substrate processing apparatus according to a first embodiment of this present disclosure.

FIG. 1 is a cross sectional view showing schematically a configuration example of the substrate processing apparatus according to the present embodiment.

(Processing Container)

As illustrated in FIG. 1, a substrate processing apparatus 100 includes a processing container 202. The processing container 202 is configured as an airtight container with a circular and flat traverse cross section. Further, the processing container 202 comprises (contains) a metal material such as aluminum (Al) or stainless steel (SUS). A processing space 201 as a process chamber in which the wafer 200 is processed, and a transfer space 203 are formed in the processing container 202. The processing container 202 is configured by a top container 202a and a bottom container 202b. A partition 204 is installed between the top container 202a and the bottom container 202b. The processing space 201 is a space surrounded by the top container 202a and located above the partition 204. The transfer space 203 is a space surrounded by the bottom container 202b and located below the partition 204.

A substrate load/unload port 206 adjacent to a gate-valve 205 is provided on a side surface of the bottom container 202b, so that the wafer 200 can be transferred between a transfer chamber not shown and the bottom container 202b, through the substrate load/unload port 206. A plurality of lift-pins 207 are provided on a bottom portion of the bottom container 202b.

A substrate support member (substrate support unit) 210 configured to support the wafer 200 is installed in the processing space 201. The substrate support member 210 mainly includes a placement surface 211 for placing the wafer 200, a substrate placement table 212 with the placement surface 211 on its surface, and a heater 213 as a heating source installed inside of the substrate placement table 212. On the substrate placement table 212 are provided a plurality of through-holes 214 through which the lift-pins 207 penetrate, at each position corresponding to each lift-pin 207.

The substrate placement table 212 is supported by a shaft 217. The shaft 217 penetrates a bottom portion of the processing container 202, and is further connected to an elevating mechanism 218 at an outside of the processing container 202. Since the shaft 217 and the substrate placement table 212 are elevated by operating the elevating mechanism 218, it is possible to elevate the wafer 200 placed on the substrate placement surface 211. Namely, the elevating mechanism 218 functions as an elevator (elevating unit) configured to elevate the substrate support member 210. Furthermore, a circumference of a bottom portion of the shaft 217 is covered with a bellows 219, and thereby an inside of the processing space 201 is kept airtight.

When the wafer 200 is transferred, the substrate placement table 212 is descended to a position (wafer transfer position) where the substrate placement surface 211 and the substrate load/unload port 206 are located at the same height. Further, as illustrated in FIG. 1, when the wafer 200 is processed, the substrate placement table 212 is elevated to a position where the wafer 200 is located at a processing position (wafer processing position) in the processing space 201.

Specifically, when the substrate placement table 212 is descended to the wafer transfer position, top end portions of the lift-pins 207 are protruded from a surface of the substrate placement surface 211, to thereby support the wafer 200 from below by lift-pins 207. Further, when the substrate placement table 212 is elevated to the wafer processing position, the penetrated lift-pins 207 are buried in the through-holes 214, to thereby support the wafer 200 from below by the substrate placement surface 211. Furthermore, since the lift-pins 207 are in contact with the wafer 200, the lift-pins 207 preferably contain a material such as quartz, or alumina.

(Exhaust System)

An exhaust port (hole) 221 configured to exhaust an internal atmosphere of the processing space 201 is provided on a side surface of an inner wall of the processing space 201 (top container 202a). An exhaust pipe 222 is connected to the exhaust port 221. A pressure regulator 223 such as APC (Auto Pressure Controller), and a vacuum pump 224 are connected in series to the exhaust pipe 222 in this order, the pressure regulator 223 controlling an internal pressure of the processing space 201 to a prescribed pressure. Further, a vacuum gauge (VG) 225 as a detection member (detection unit) configured to detect the internal pressure of the processing space 201, is connected to the exhaust pipe 222 between the exhaust port 221 and the pressure regulator 223. An exhaust system 220 is mainly configured by the exhaust port 221, the exhaust pipe 222, the pressure regulator 223, and the vacuum pump 224.

(Gas Introduction Port)

A gas introduction port (hole) 241 is provided on a later-described top surface (ceiling wall) of a shower head 230 provided on a top portion of the processing space 201, as a gas supply port configured to supply various types of gases into the processing space 201. A gas supply system is connected to the gas introduction port 241. A configuration of this gas supply system will be described later.

(Shower Head)

The shower head 230 is provided between the gas introduction port 241 and the processing space 201, as a gas dispersion mechanism. The gas introduction port 241 is connected to a lid 231 of the shower head 230. A gas introduced from the gas introduction port 241 is supplied into a buffer space 232 of the shower head 230, through a hole 231a provided on the lid 231.

The lid 231 of the shower head 230 contains a metal for example. An insulator block 233 is provided between the lid 231 and the top container 202a, and insulates between the lid 231 and the top container 202a.

A dispersion plate 234 for dispersing the gas introduced from the gas introduction port 241 is provided to the shower head 230, so that the dispersion plate 234 is located between the buffer space 232 and the processing space 201. The dispersion plate 234 is disposed to face the substrate placement surface 211. Further, a plurality of through-holes 234a are formed to the dispersion plate 234.

A gas guide 235 is provided in the buffer space 232, for forming a flow of supplied gas. The gas guide 235 has a conical shape of expanding its diameter toward the dispersion plate 234, with the hole 231a as an apex.

An exhaust pipe 236 may be connected to a side of the buffer space 232. A valve 237 for switching on/off of the exhaust, a pressure regulator 238 such as APC for controlling an internal pressure of the buffer space 232 to a prescribed pressure, and a vacuum pump 239 are connected in series to the exhaust pipe 236 in this order.

(Gas Supply System)

As described above, the gas supply system is connected to the gas introduction port 241. The gas supply system includes a common gas supply pipe 242, a first gas supply system 243, a second gas supply system 244, a third gas supply system 245, and a remote plasma unit (RPU) 250.

(First Gas Supply System)

A gas supply pipe 243a of the first gas supply system 243 is connected to the common gas supply pipe 242 which is connected to the gas introduction port 241. A gas supply source 243b, a mass flow controller (MFC) 243c which is a flow rate controller (a flow rate control unit), and a valve 243d which is an opening/closing valve are connected to the gas supply pipe 243a sequentially from an upstream side of gas flow.

A gas containing a first element (referred to as "first element-containing gas" hereafter) is stored in the gas supply source 243b. The first element-containing gas passes through the MFC 243c and the valve 243d which are provided on the gas supply pipe 243a, and flows into the common gas supply pipe 242, and further is supplied into the processing container 202 through the shower head 230.

The first element-containing gas is one of source gases, namely, processing gases. Here, a first element is a metal element for example. In this case, the first element-containing gas is a metal-containing gas for example. In the present embodiment, titanium (Ti) is used as the metal element. For example, TDMAT (Tetrakis-Dimethyl-Amino-Titanium: Ti[N(CH$_3$)$_2$]$_4$) gas can be used as a titanium-containing gas. TDMAT is a liquid source, and for example, can be used as a gas source by being vaporized using a vaporizer (not shown) provided as a component of the gas supply source 243b.

TiCl$_4$, or the like, may be used as the titanium-containing gas. Further, the metal element is not limited to titanium, and may be other element such as tungsten (W), tantalum (Ta), zirconium (Zr), hafnium (Hf), ruthenium (Ru), cobalt (Co), or nickel (Ni). Further, the first element-containing gas is not limited to the metal-containing gas, and may be a silicon-containing gas, or the like.

(Second Gas Supply System)

A gas supply pipe 244a of the second gas supply system 244 is connected to the common gas supply pipe 242 through the RPU 250. A gas supply source 244b, an MFC 244c, and a valve 244d are provided on the gas supply pipe 244a sequentially from an upstream side of gas flow.

A gas containing a second element (referred to as "second element-containing gas" hereafter) is stored in the gas supply source 243b. The second element-containing gas passes through the MFC 244c and the valve 244d which are provided on the gas supply pipe 244a, and then is supplied to the RPU 250. The second element-containing gas supplied to the RPU 250 is plasma-excited when passing through the RPU 250. The plasma-excited second element-containing gas flows into the common gas supply pipe 242, and further is supplied into the processing container 202 through the shower head 230.

The second element-containing gas is one of the processing gases. Further, the second element-containing gas may be considered as a reactant gas or a modification gas.

Here, the second element-containing gas is an oxygen-containing gas as an oxidant, and contains an oxygen element (O). In the present embodiment, oxygen ($O_2$) gas is used as the oxygen-containing gas. The second element-containing gas is not limited to the oxygen-containing gas, and may be a nitrogen-containing gas as a nitriding agent, and for example may be ammonia ($NH_3$) gas. Further, other gas that can be activated by plasma may also be used as the second element-containing gas.

(Third Gas Supply System)

A gas supply pipe 245a of the third gas supply system 245 is connected to the common gas supply pipe 242. A gas supply source 245b, an MFC 245c, and a valve 245d are provided on the gas supply pipe 245a sequentially from an upstream side of gas flow.

Inert gas is stored in the gas supply source 245b. The inert gas passes through the MFC 245c and the valve 245d which are provided on the gas supply pipe 245a, and flows into the common gas supply pipe 242, and further is supplied into the processing container 202 through the shower head 230.

In the present embodiment, nitrogen ($N_2$) gas is used as the inert gas. Further, for example, a rare gas such as helium (He) gas, neon (Ne) gas, or argon (Ar) gas may be used as the inert gas other than $N_2$ gas.

(Remote Plasma Unit)

The RPU 250 functions as a plasma generation member (plasma generation unit) to make $O_2$ gas in plasma state, the $O_2$ gas being supplied to the wafer 200. For example, ICP (Inductively Coupled Plasma) apparatus may be used as the RPU 250. The ICP apparatus is configured by an induction coil, a high frequency power source for supplying electrical power to the induction coil, etc., and configured to generate (ignite) plasma as long as an impedance matching of the RPU 250 is obtained (for example, as long as an impedance of the RPU 250 is 50Ω or a value in the vicinity of 50Ω) when electrical power is supplied to the induction coil from the high frequency power source, to make a gas supplied to the RPU 250 in plasma state. A matching state (impedance) of the RPU 250 is changed depending on a gas atmosphere (a type of the gas, pressure, or the like) of a space in the RPU 250. The RPU 250 is not limited to the ICP apparatus, and may be ECR (Electron Cyclotron Resonance) apparatus, CCP (Capacitively Coupled Plasma) apparatus, or the like.

(Controller)

The substrate processing apparatus 100 includes a controller 260 as a control unit configured to control an operation of each part of the substrate processing apparatus 100. The controller 260 includes at least a calculation part (calculation unit) 261 and a memory part (memory unit) 262.

The memory part 262 readably stores control program for controlling the operation of the substrate processing apparatus 100, process recipe recording a procedure (sequence) or a condition of substrate processing, etc., calculation data or processing data generated in a process up to setting the process recipe used for processing directed to the wafer 200 (also referred to as "wafer processing" hereafter), or the like. The process recipe is a combination of recipes so that each sequence in the substrate processing step is executed by the controller 260 and a prescribed result can be obtained, and the process recipe functions as a program. Hereafter, the process recipe, the control program, and the like, will be collectively and simply referred to as "program". Furthermore, a case of using the term "program" includes a case of including only the process recipe alone, a case of including only the control program alone, or a case of including both the process recipe and the control program.

The calculation part 261 is configured to read the program from the memory part 262 and execute this program. Thereby, the controller 260 reads the program from the memory part 262 according to an instruction, etc., from a host device or user, and controls the operation of each configuration of the substrate processing apparatus 100 according to a content of the instruction. Specifically, for example, the controller 260 controls an elevating operation by the elevating mechanism 218 for elevating the wafer 200 placed on the substrate placement surface 211 of the substrate support member 210. In this event, the controller 260 may control the elevating operation based on a detection result by the VG 225, as described later in detail.

The controller 260 may be configured as a dedicated computer, or may be configured as a general-purpose computer. For example, an external memory device 263 storing the above program (for example, a magnetic disc such as a magnetic tape, a flexible disc, or a hard disc, an optical disc such as CD or DVD, a magneto-optical disc such as MO, and a semiconductor memory such as USB memory (USB Flash Drive) or a memory card) is prepared, and the program is installed on the general-purpose computer using the external memory device 263. Thereby, the controller 260 according to the present embodiment can be configured.

Further, means for supplying the program to a computer is not limited to a case that it is supplied through the external memory device 263. For example, the program may be supplied to a computer using a communication means such as Internet or a dedicated line, without passing through the external memory device 263. The memory part 262 and the external memory device 263 are configured as a non-transitory computer-readable recording medium. Hereafter, the memory part 262 and the external memory device 263 will be collectively and simply referred to as "recording medium". A case of using the term "recording medium" includes a case of including only the memory part 262 alone, a case of including only the external memory device 263 alone, or a case of including both the memory part 262 and the external memory device 263.

(2) Outline of Substrate Processing Step

Next, an outline of a substrate processing step will be described as one step of manufacturing processing of a semiconductor device, in the substrate processing step is performed a prescribed wafer processing directed to the wafer 200 using the substrate processing apparatus 100 with the above configuration.

Figure 2:
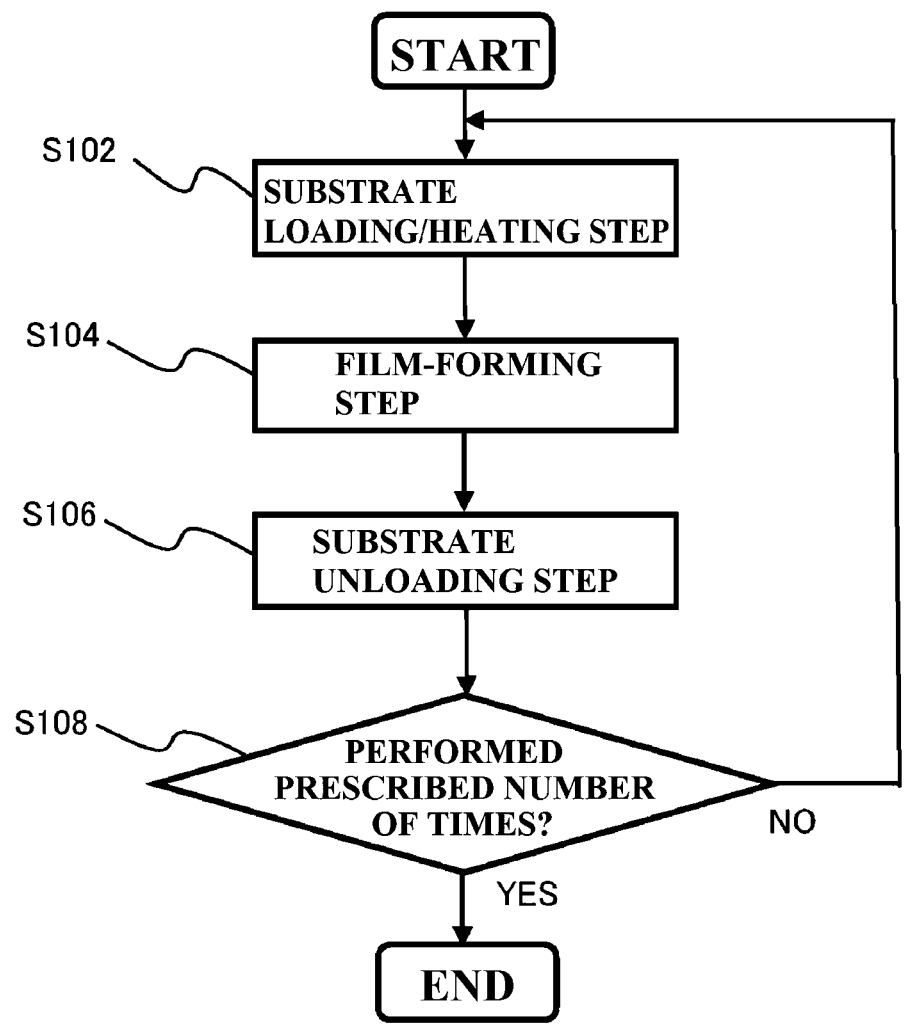
FIG. 2 is a flowchart showing an outline of a substrate processing step performed using the substrate processing apparatus according to the first embodiment of this present disclosure.

FIG. 2 is a flowchart showing the outline of the substrate processing step according to the present embodiment.

The present embodiment shows, for example, a case of forming a thin film on the wafer 200, as the substrate processing step. Furthermore, in the following descriptions, the operation of each part configuring the substrate processing apparatus 100 is controlled by the controller 260.

(Substrate Loading/Heating Step: S102)

First, a substrate loading/heating step (S102) will be described.

In the substrate loading/heating step (S102), the substrate placement table 212 is descended to the transfer position of the wafer 200, and to thereby pass the lift-pins 207 through the through-holes 214 of the substrate placement table 212. Therefore, the lift-pins 207 are set in a protruding state by a prescribed height from the surface of the substrate placement surface 211. Then, the gate-valve 205 is opened, the wafer 200 is loaded into the transfer space 203 of the processing container 202 using a wafer transfer machine not shown, and the wafer 200 is transferred on the lift-pins 207. Thereby, the wafer 200 is supported in a horizontal posture on the lift-pins 207 protruding from the surface of the substrate placement table 212.

After the wafer 200 is loaded into the transfer space 203, the wafer transfer machine is moved to the outside of the processing container 202, and then the processing container 202 is sealed by closing the gate-valve 205. Thereafter, the substrate placement table 212 is elevated, and thereby the wafer 200 is placed on the substrate placement surface 211 of the substrate placement table 212.

When the wafer 200 is loaded into the transfer space 203, $N_2$ gas as the inert gas is preferably supplied into the processing container 202 from the third gas supply system while exhausting an inside of the processing container 202 by the exhaust system. Namely, $N_2$ gas is preferably supplied into the processing container 202 by opening at least the valve 245d of the third gas supply system, in a state that the inside of the processing container 202 is exhausted by operating the vacuum pump 224 and opening the APC valve 223. Thereby, it is possible to prevent the particle from entering into the processing container 202, or from adhering onto the wafer 200. Further, the vacuum pump 224 is continuously operated at least from the substrate loading/heating step (S102) to a substrate unloading step (S106) described later.

When the wafer 200 is placed on the substrate placement table 212, electrical power is supplied to the heater 213 embedded in the substrate placement table 212, and a temperature of a surface of the wafer 200 is controlled to a prescribed temperature. The temperature of the wafer 200 is for example a room temperature or more and 500° C. or less, preferably the room temperature or more and 400° C. or less. A temperature of the heater 213 is adjusted by controlling energization to the heater 213 based on temperature information detected by a temperature sensor not shown.

(Film-Forming Step: S104)

Next, a film-forming step (S104) will be described.

After the wafer 200 is positioned at the processing position in the processing space 201, in the substrate processing apparatus 100, the film-forming step (S104) is performed. The film-forming step (S104) is a step of forming a thin film on the wafer 200 by supplying the first element-containing gas and the second element-containing gas which are different processing gases each other, into the processing space 201, according to process recipe. The film-forming step (S104) will be described in detail later.

(Substrate Unloading Step: S106)

Next, a substrate unloading step (S106) will be described.

After end of the film-forming step (S104), in the substrate processing apparatus 100, the substrate unloading step (S106) is performed. In the substrate unloading step (S106), the processed wafer 200 is unloaded to the outside of the processing container 202 in a reverse procedure to the above substrate loading/heating step (S102). Namely, the substrate placement table 212 is descended, and the wafer 200 is supported on the lift-pins 207 protruding from the surface of the substrate placement table 212. Thereafter, the gate-valve 205 is opened, and the wafer 200 is unloaded to the outside of the processing container 202 using the wafer transfer machine.

(Judgement Step: S108)

Next, a judgement step (S108) will be described.

After end of the substrate unloading step (S106), a series of processing (S102 to S106) is set as one cycle, and the substrate processing apparatus 100 judges whether or not this one cycle is performed a prescribed number of times. Namely, after the wafer 200 is unloaded, the substrate processing apparatus 100 judges whether or not the film-forming step (S104) is performed a prescribed number of times. When the substrate processing apparatus 100 judges that the film-forming step (S104) is performed the prescribed number of times, the substrate processing step is ended. Further, a cleaning step may be performed before ending the substrate processing step. On the one hand, when the substrate processing apparatus 100 judges that the film-forming step (S104) is not performed the prescribed number of times, the processing is returns to the substrate loading/heating step (S102) in order to start processing of waiting wafers 200.

(3) Basic Procedure of Film-Forming Step

Next, a basic procedure of the film-forming step (S104) of the above substrate processing step will be described.

Figure 3:
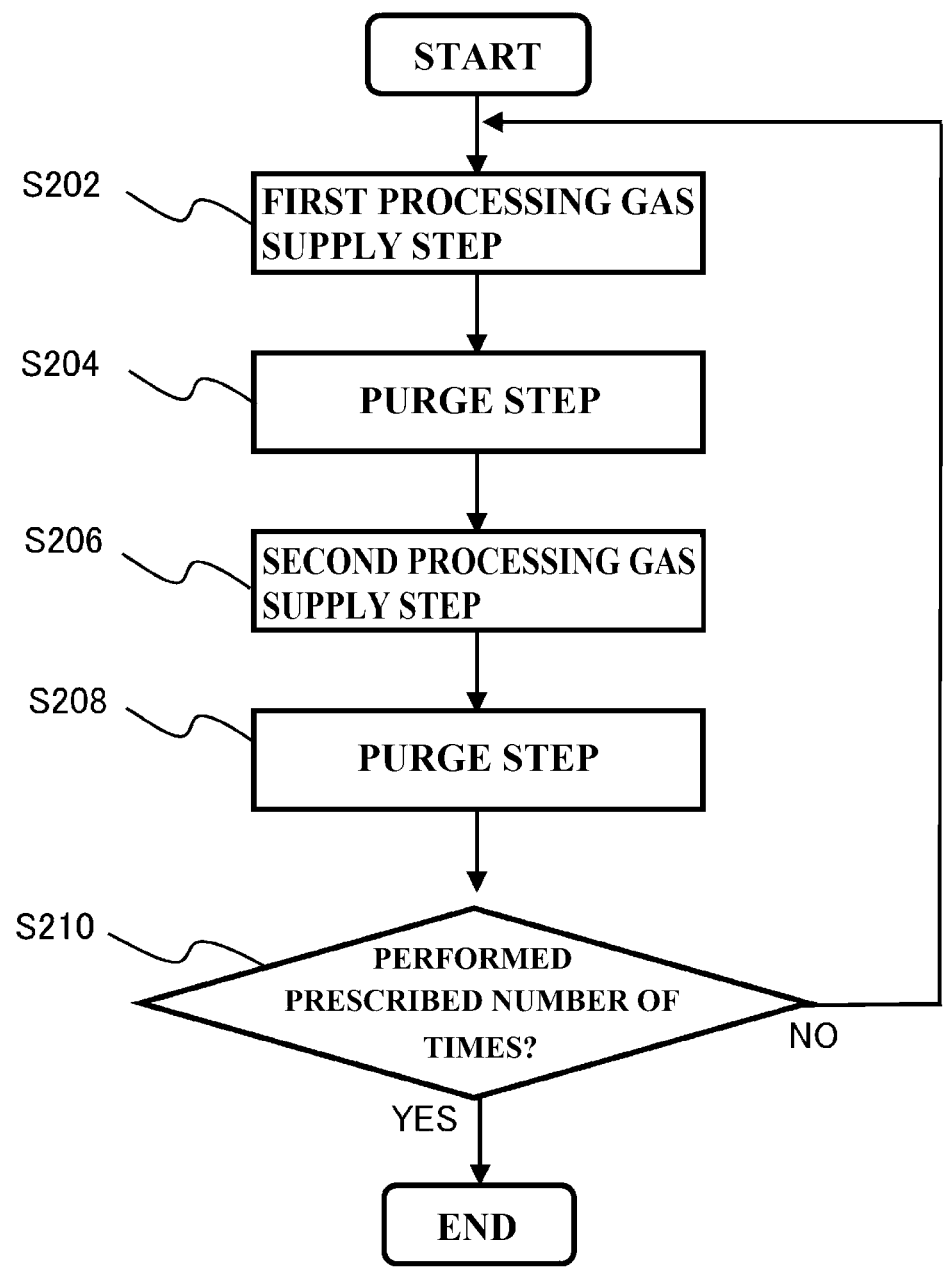
FIG. 3 is a flowchart showing a basic procedure of a film-forming step performed using the substrate processing apparatus according to the first embodiment of this present disclosure.

FIG. 3 is a flowchart showing a basic procedure of the film-forming step according to the present embodiment.

Explanation will be given herein for an example of supplying alternately above TDMAT gas, and $O_2$ gas in plasma state, and forming a titanium oxide ($TiO_2$) film which is a high dielectric constant insulation film, on the wafer 200. A prescribed film may be formed in advance on the wafer 200. Further, a prescribed pattern may be formed in advance on the wafer 200 or the prescribed film.

(First Processing Gas Supply Step: S202)

A first processing gas supply step (S202) will be described.

In the film-forming step, in a state that the temperature of the wafer 200 reaches a prescribed temperature by heating, first, the valve 243d is opened, and a supply of TDMAT gas is started into the processing space 201 of the processing container 202. In this event, the MFC 243c is adjusted so that a flow rate of TDMAT gas is a prescribed flow rate. A supply flow rate of TDMAT gas is 1 sccm or more and 100 sccm or less, for example. Further, an internal pressure of the processing container 202 is controlled to a prescribed pressure by adjusting a degree of valve opening of the APC valve 223. In addition, $N_2$ gas as a carrier gas may be supplied together with TDMAT gas by connecting an inert gas supply system to the first gas supply system 243. Furthermore, in order to prevent a vaporized TDMAT from liquefying, a temperature of TDMAT gas may be maintained at a prescribed temperature by controlling a temperature of the first gas supply system 243 to a prescribed temperature.

TDMAT gas supplied into the processing container 202 reaches the surface of the wafer 200. Thereby, a metal-containing layer (titanium-containing layer) is formed as a "first element-containing layer" on the surface of the wafer 200, by contact with TDMAT gas. The metal-containing layer with a prescribed thickness and a prescribed distribution, is formed according to the internal pressure of the processing container 202, the flow rate of TDMAT gas, a temperature of the substrate placement table 212, a time required for TDMAT gas to pass through the processing space 201, etc., for example.

After elapse of a prescribed time since the supply of TDMAT gas is started, the valve 243d is closed, and the supply of TDMAT gas is stopped.

(Purge Step: S204)

Next, a purge step (S204) will be described.

After end of the first processing gas supply step (S202), the valve 245d is opened, and an inert gas ($N_2$ gas) as a purge gas is supplied into the processing space 201 of the processing container 202. In this event, as described above, the inside of the processing container 202 is exhausted by operations of the vacuum pump 224 and the APC valve 223. Thereby, $N_2$ gas supplied into the processing container 202 is discharged from the processing container 202 while removing excess TDMAT gas (not contributed to the film formation) from the surface of the wafer 200, the gas being supplied in the first processing gas supply step (S202). Further, when the exhaust pipe 236 is installed, TDMAT gas remaining in the shower head 230 is also removed by opening the valve 237, and controlling the pressure regulator 238 and the vacuum pump 239. After the purge is performed for a prescribed time, the valve 245d is closed to stop a supply of $N_2$ gas, and the valve 237 is closed to shut off between the shower head 230 and the vacuum pump 239. A supply flow rate of $N_2$ gas is 0.1 sccm or more and 10 sccm or less, for example.

(Second Processing Gas Supply Step: S206)

Next, a second processing gas supply step (S206) will be described.

After end of the purge step (S204), the valve 244d is opened, $O_2$ gas is plasma-excited by the RPU 250, and this $O_2$ gas in plasma state is supplied into the processing space 201. In this event, the MFC 244c is adjusted so that a flow rate of $O_2$ gas is a prescribed flow rate. A supply flow rate of $O_2$ gas is set to 0.1 sccm or more and 10 sccm or less, for example. Further, the internal pressure of the processing container 202 is controlled to a prescribed pressure by adjusting properly the degree of valve opening of the APC valve 223. In addition, $N_2$ gas as the carrier gas may be supplied together with $O_2$ gas by connecting an inert gas supply system to the second gas supply system 244.

When $O_2$ gas is supplied, the RPU 250 is turned ON, and an application of electrical power required for making $O_2$ gas in plasma state is started. Due to matching of $O_2$ gas supplied to the RPU 250, plasma is ignited promptly and $O_2$ gas is made in plasma state.

The $O_2$ gas in plasma state reaches the surface of the wafer 200. Thereby, on the surface of the wafer 200, the already formed metal-containing layer (titanium-containing layer) is modified (oxidized) by plasma of $O_2$ gas, to form a metal oxide film ($TiO_2$ film). The metal oxide film being a modified layer is formed, with a prescribed thickness, a prescribed distribution, and an infiltration depth of a prescribed oxygen component into the metal-containing layer, according to the internal pressure of the processing container 202, the flow rate of $O_2$ gas, the temperature of the substrate placement table 212, the electric power supplied to the RPU 250, or the like, for example.

After elapse of the prescribed time, the valve 244d is closed, and the supply of $O_2$ gas is stopped. In this event, since the supply of $O_2$ gas to the RPU 250 is ended, the matching is lost, and plasma is extinguished (disappears) promptly.

(Purge Step: S208)

Next, a purge step (S208) will be described.

After end of the second processing gas supply step (S206), the valve 245d is opened, and $N_2$ gas is supplied into the processing space 201 of the processing container 202. $N_2$ gas supplied into the processing container 202 is discharged from the processing container 202 while removing excess $O_2$ gas (not contributed to the film formation) from the surface of the wafer 200, the $O_2$ gas being supplied in the second processing gas supply step (S206). Further, when the exhaust pipe 236 is installed, $O_2$ gas remaining in the shower head 230 is also removed by opening the valve 237, and controlling the pressure regulator 238 and the vacuum pump 239. After the purge is performed for a prescribed time, the valve 245d is closed to stop the supply of $N_2$ gas, and the valve 237 is closed to shut off between the shower head 230 and the vacuum pump 239. A supply flow rate of $N_2$ gas is 0.1 sccm or more and 10 sccm or less, for example.

(Judgement Step: S210)

Next, a judgement step (S210) will be described.

After end of the purge step (S208), subsequently, a series of processing (S202 to S208) is set as one cycle, and the controller 260 judges whether or not this one cycle is performed a prescribed number of times (n-cycle). When the cycle is not performed the prescribed number of times, the cycle from the first processing gas supply step (S202) to the purge step (S208) is repeated. On the one hand, after the cycle is performed the prescribed number of times, the film-forming step (S104) is ended.

As described above, in the film-forming step (S104), the metal oxide film ($TiO_2$ film) with a prescribed thickness is deposited on the wafer 200 by sequentially performing each step from the first processing gas supply step (S202) to the purge step (S208). Further, a series of the above processing is set as one cycle, a thickness of the metal oxide film ($TiO_2$ film) formed on the wafer 200 is controlled to a prescribed film thickness, by repeating this one cycle a prescribed number of times.

The present embodiment shows, for example, a case of performing cyclic (alternate supply) processing of repeating a step of alternately supplying TDMAT gas and $O_2$ gas. However, the film-forming step (S104) is not limited thereto. Namely, not cyclic processing but, for example, CVD (Chemical vapor deposition) processing may be performed with the first processing gas (first element-containing gas) and the second processing gas (second element-containing gas) present simultaneously in the processing space 201, as long as the film-forming step (S104) is a step of forming a thin film by supplying the first processing gas and the second processing gas.

(4) Processing in Film-Forming Step

Next, a processing in the film-forming step according to the present embodiment will be described.

As described above, in the film-forming step (S104), the thin film such as a metal oxide film ($TiO_2$ film) is formed on the wafer 200 placed on the substrate placement surface 211 by supplying various types of gases into the processing space 201 from the gas introduction port 241 as the gas supply port. Therefore, for example, when an interval between the gas introduction port 241 and the wafer 200 is large, it may be necessary to flow a large amount of the first processing gas, and the like, in order to improve a film-formation performance. Namely, an interval (also referred to as "gap" hereafter) between a surface of the dispersion plate 234 and the wafer 200 may affect a quality of the wafer processing (for example, a quality of the thin film formed on the wafer 200). In a case of an apparatus without the dispersion plate 234, an interval between the gas introduction port 241 and the wafer 200 corresponds to the gap of this present disclosure. Further, an interval between the wafer 200 and a member facing the wafer 200 (for example, the lid 231) corresponds to the gap of this present disclosure.

Therefore, in the present embodiment, in order to make it possible to improve the quality of the wafer processing (for example, the quality of the film to be formed), the controller 260 controls the elevating operation by the elevating mechanism 218. Specifically, the controller 260 controls the elevating operation by the elevating mechanism 218 so as to differentiate the gap between the gas introduction port 241 and the wafer 200 on the substrate placement surface 211, when a gas is supplied into the processing space 201 from the gas introduction port 241. More specifically, the controller 260 controls so as to differentiate the gap by a control pattern described later.

(First Control Pattern)

First, a first control pattern will be described.

Figure 4:
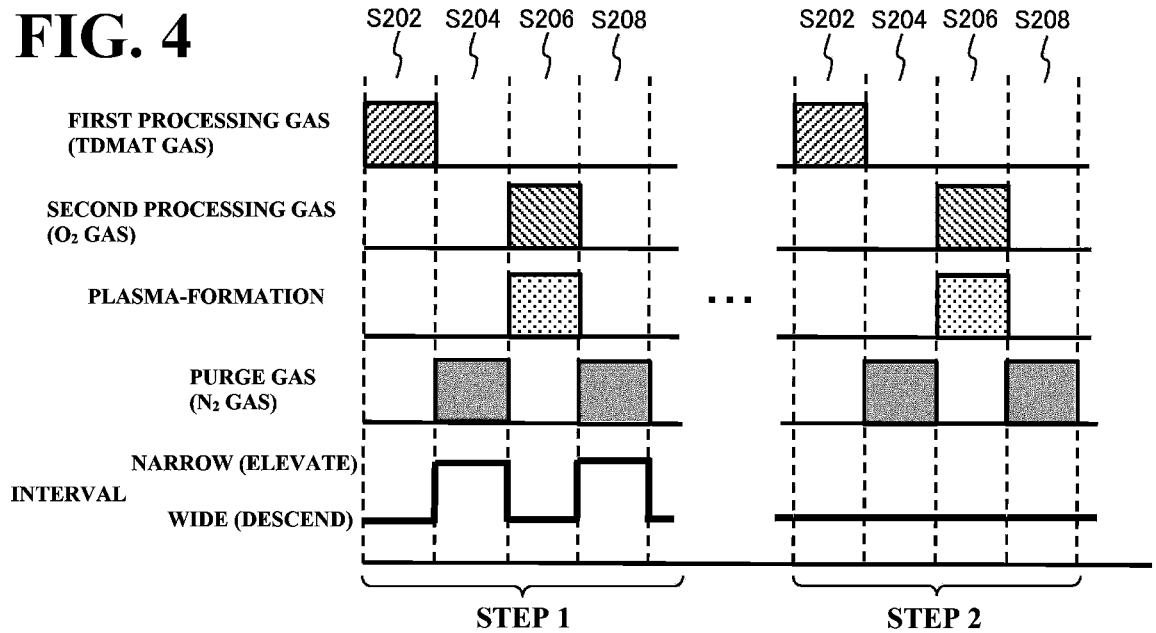
FIG. 4 is a chart showing an example of a first control pattern in the film-forming step performed using the substrate processing apparatus according to the first embodiment of this present disclosure.

FIG. 4 is a chart showing an example of the first control pattern in the film-forming step performed using the substrate processing apparatus according to the present embodiment.

As illustrated in FIG. 4, in the first control pattern, the gap is differentiated when performing the purge steps (S204, S208) in the film-forming step of performing cyclic processing. Further, in the first control pattern, each cycle constituting cyclic processing is formed in two steps, and the gap is differentiated in a different way in each step. 2 step formation is performed in such a way that each step is switched at a preset rate (frequency), so that usually step 1 is performed and the processing is moved to step 2 at a rate of once every 5 cycles.

Specifically, in step 1, the gaps in the purge steps (S204, S208) are narrower than the gaps in the first processing gas supply step (S202) and the second processing gas supply step (S206). Namely, the elevating operation by the elevating mechanism 218 is controlled so as to narrow the gap by moving the wafer 200 close to the gas introduction port 241 in the purge steps (S204, S208).

When the gaps in the purge steps (S204, S208) are narrowed, $N_2$ gas as the purge gas strikes strongly the wafer 200. Therefore, it is possible to remove effectively a remaining gas, by-products, particles, or the like, which adhere to the surface of the wafer 200, from the surface of the wafer 200. This contributes to improving the quality of the thin film formed on the wafer 200. Particularly, this is extremely effective in a case of using a high adsorptive gas in the first processing gas supply step (S202) and the second processing gas supply step (S206). Specifically, this is extremely effective to remove the remaining gas, by-products, or particles, not only in a case of using TDMAT gas as the material gas (precursor) and using $O_2$ gas as the reactant gas or the modification gas (reactant), respectively, as shown in the present embodiment, but also in a case of using $TiCl_4$ gas as the precursor and using $NH_3$ gas as the reactant, respectively, and $NH_4Cl$ as the by-product is formed by these gases.

The present embodiment shows, for example, a case of a control aspect in which the gaps in the purge steps (S204, S208) are narrower than the gaps in the first processing gas supply step (S202) and the second processing gas supply step (S206). However, the control aspect is not limited thereto, as long as the remaining gas, by-products, particles, and the like, can be effectively removed. For example, if the gap has already been narrowed in the first processing gas supply step (S202) or the second processing gas supply step (S206), the narrow gap may be maintained even in the purge steps (S204, S208).

Further, in the purge steps (S204, S208), in addition to narrow the gap, the internal pressure of the processing container 202 may be adjusted so as to easily remove the remaining gas, by-products, particles, and the like. Specifically, adjusting the internal pressure of the processing container 202 to be low can be considered.

After moving to step 2, in step 2, the gaps are widened in the purge steps (S204, S208) unlike the case of step 1. For example, in a case that the gaps are wide in the first processing gas supply step (S202) and the second processing gas supply step (S206), the elevating operation by the elevating mechanism 218 is controlled so that the wide gaps are maintained even in the purge steps (S204, S208).

By widening the gaps in the purge steps (S204, S208), $N_2$ gas as the purge gas can be easily spread over the entire processing space 201 of the processing container 202. Therefore, it is possible to remove efficiently the remaining gas, by-products, particles, and the like, in the processing space 201, in a short time. Particularly, by performing step 2 at a stage when the remaining gas, by-products, particles, and the like, in the processing space 201, are accumulated, they can be removed extremely effectively and efficiently.

The present embodiment shows, for example, a case that the gap is narrowed in step 1, and then the gap is widened in step 2. However, the sequence of performing step 1 and step 2 may be reversed.

In both step 1 and step 2, a size of the gap (namely, a height position of the wafer 200 on the substrate placement surface 211 with respect to the gas introduction port 241) can be adjusted in mm units for example by controlling the elevating operation by the elevating mechanism 218.

As described above, in the first control pattern, the gap between the gas introduction port 241 and the wafer 200 on the substrate placement surface 211 is differentiated, depending on a timing of the wafer processing performed by supplying a gas from the gas introduction port 241, so that the gap is differentiated so as to be narrowed in step 1 and so as to be widened in step 2 of two steps.

Further, in the first control pattern, the gap between the gas introduction port 241 and the wafer 200 on the substrate placement surface 211 is differentiated, depending on the type of the gas supplied from the gas introduction port 241, so that the gap is differentiated so as to be narrowed when the purge gas is supplied.

(Second Control Pattern)

Next, a second control pattern will be described.

Figure 5:
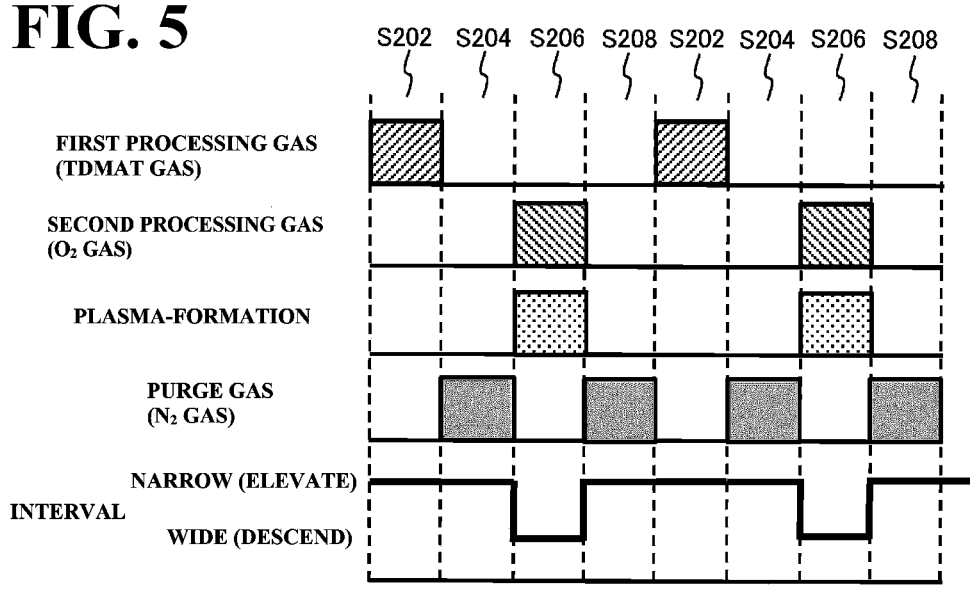
FIG. 5 is a chart showing an example of a second control pattern in the film-forming step performed using the substrate processing apparatus according to the first embodiment of this present disclosure.

FIG. 5 is a chart showing an example of the second control pattern in the film-forming step performed using the substrate processing apparatus according to the present embodiment.

As illustrated in FIG. 5, in the second control pattern, the gap is differentiated between the first processing gas supply step (S202) and the second processing gas supply step (S206) in the film-forming step of performing cyclic processing.

Specifically, the elevating operation by the elevating mechanism 218 is controlled so that the gap is narrowed by moving the wafer 200 close to the gas introduction port 241 in the first processing gas supply step (S202). By narrowing the gap in the first processing gas supply step (S202), TDMAT gas as a precursor strikes strongly the wafer 200. Therefore, an adsorption amount (concentration) of the first element (titanium) on the wafer 200 is increased.

On the one hand, the elevating operation by the elevating mechanism 218 is controlled so that the gap is widened by keeping the wafer 200 away from the gas introduction port 241 in the second processing gas supply step (S206). By widening the gap in the second processing gas supply step (S206), $O_2$ gas as the reactant can be easily spread over the entire processing space 201 of the processing container 202. Therefore, $O_2$ gas can be supplied uniformly to the wafer 200.

Namely, in the second control pattern, since the gap is differentiated between the first processing gas supply step (S202) and the second processing gas supply step (S206), it is possible to improve an in-plane uniformity when the reactant is supplied, while improving the adsorption amount (concentration) when the precursor is supplied. This contributes to improving the quality of the thin film formed on the wafer 200.

As described above, in the second control pattern, the gap between the gas introduction port 241 and the wafer 200 on the substrate placement surface 211 is differentiated, depending on the type of the gas supplied from the gas introduction port 241, so that the gap is narrowed when the precursor is supplied and widened when the reactant is supplied.

(Third Control Pattern)

Next, a third control pattern will be described.

Figure 6:
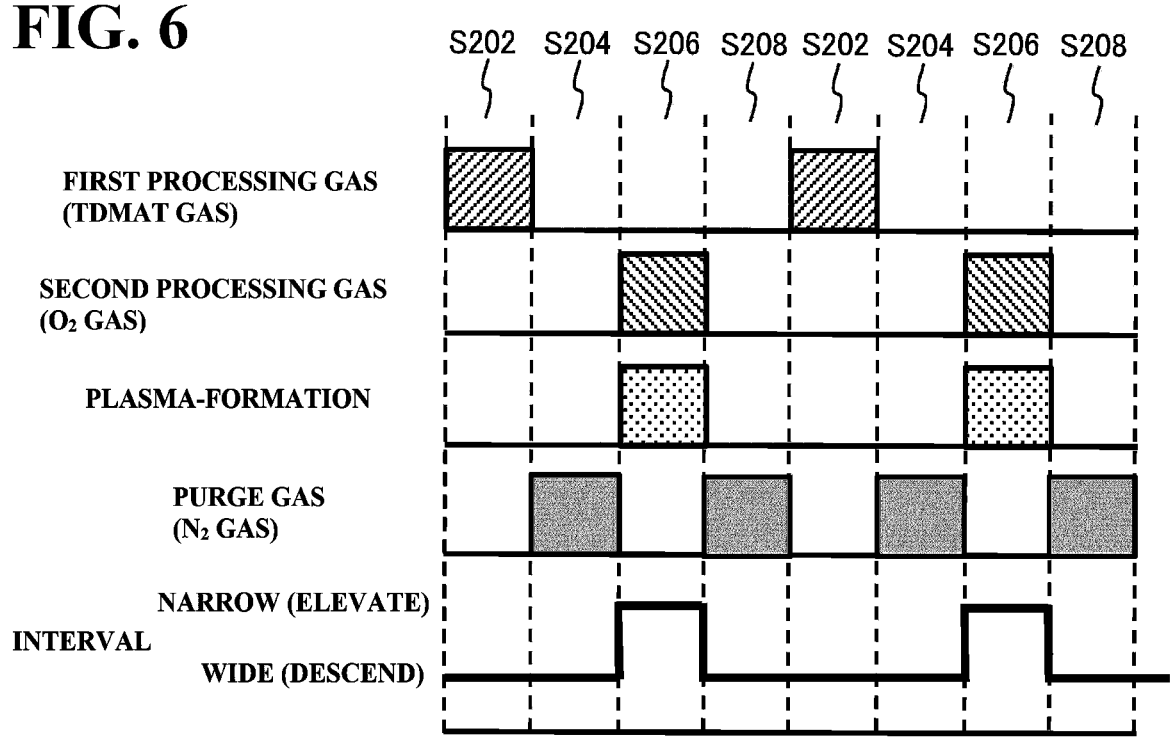
FIG. 6 is a chart showing an example of a third control pattern in the film-forming step performed using the substrate processing apparatus according to the first embodiment of this present disclosure.

FIG. 6 is a chart showing an example of the third control pattern in the film-forming step performed using the substrate processing apparatus according to the present embodiment.

As illustrated in FIG. 6, in the third control pattern, the gap is differentiated in the second processing gas supply step (S206) involving plasma formation, in the film-forming step of performing cyclic processing.

Specifically, the gap in the second processing gas supply step (S206) involving plasma formation, is narrower than the gaps in the first processing gas supply step (S202) and the purge steps (S204, S208). Namely, the elevating operation by the elevating mechanism 218 is controlled so that the gap is narrowed by moving the wafer 200 close to the gas introduction port 241, in the step (S206) of making a gas in plasma state.

By narrowing the gap in the plasma-forming step (S206), active species in plasma strike strongly the wafer 200 before being deactivated. Namely, a gas in plasma state reaches the surface of the wafer 200, while keeping a high plasma energy state. Therefore, on the wafer 200, the already formed metal-containing layer (titanium-containing layer) can be modified (oxidized) efficiently by plasma. Thereby, the quality of the thin film formed on the wafer 200 can be improved.

The present embodiment shows, for example, a case of narrowing the gap in the plasma-forming step (S206). However, the present embodiment is not limited thereto. For example, as illustrated in FIG. 5, a pattern for widening the gap in the plasma-forming step (S206) may be used as the control pattern. By widening the gap in the plasma-forming step (S206), the active species in plasma can be easily spread over the entire processing space 201 of the processing container 202. Therefore, an in-plane uniformity of processing utilizing plasma can be easily improved. In addition, by widening the gap in the plasma-forming step (S206), an internal stress of the wafer 200 can be relaxed because plasma energy for the wafer 200 can be suppressed low. Namely, by widening the gap in the plasma-forming step (S206), the quality of the thin film formed on the wafer 200 can also be improved.

As described above, in the third control pattern, the gap between the gas introduction port 241 and the wafer 200 on the substrate placement surface 211 is differentiated, depending on a content of the wafer processing, for example, the gap is differentiated between when performing the plasma-forming step (S206) using the RPU 250 and when performing the plasma non-forming steps (S202, S204, S208).

Incidentally, the third control pattern may be a pattern as follows.

Figure 7:
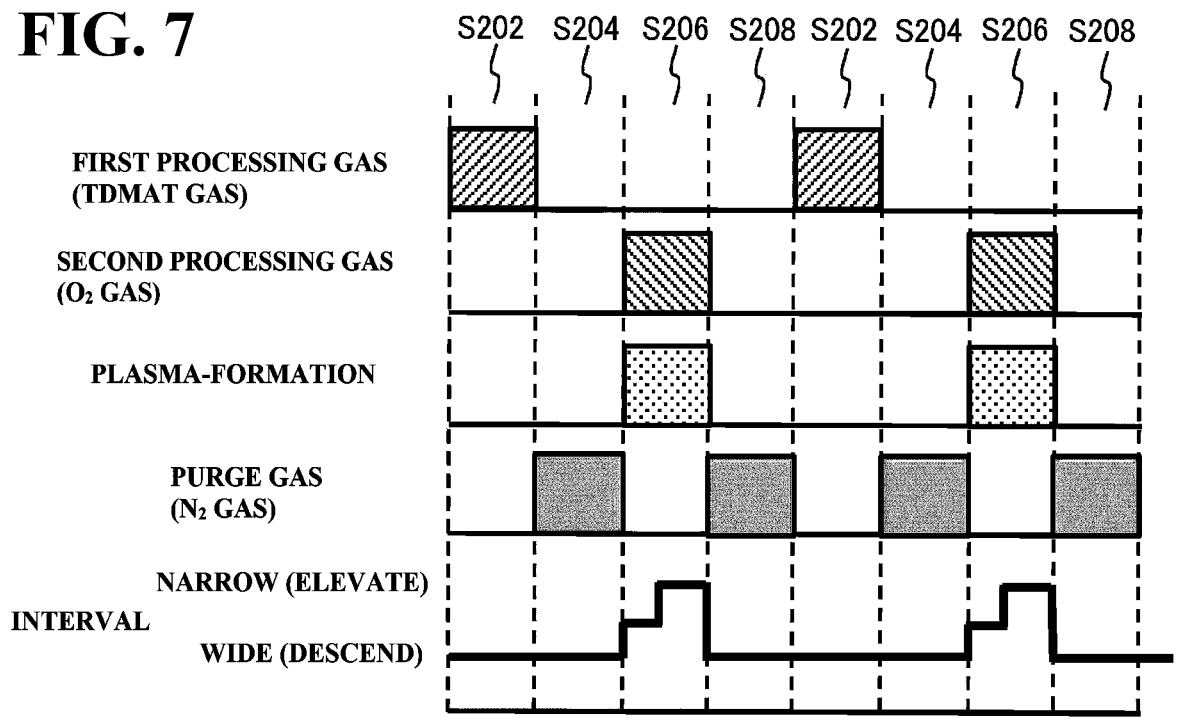
FIG. 7 is a chart showing a modified example of the third control pattern in the film-forming step performed using the substrate processing apparatus according to the first embodiment of this present disclosure.

FIG. 7 is a chart showing a modified example of the third control pattern in the film-forming step performed using the substrate processing apparatus according to the present embodiment.

As illustrated in FIG. 7, in the modified example of the third control pattern, the gap is differentiated between a certain period immediately after start of the second processing gas supply step (S206) involving plasma formation and the remaining period thereof after elapse of the certain period.

Specifically, since plasma does not stabilize in the certain period immediately after start of the second processing gas supply step (S206), there is a possibility that uniformity of a film thickness is affected thereby. Therefore, the elevating operation by the elevating mechanism 218 is controlled so that the gap in the above certain period is wider than the gap in the remaining period, in order to keep the wafer 200 away from the gas introduction port 241. Since plasma stabilizes after elapse of the certain period immediately after start of the step (S206), the elevating operation by the elevating mechanism 218 is controlled so that the gap after elapse of the certain period immediately after start of the step (S206) is narrower than the gap in the certain period, in order to move the wafer 200 close to the gas introduction port 241.

Namely, the gap is differentiated so as to be widened in the certain period immediately after start of the step (S206) and so as to be narrowed in the remaining period after elapse of the certain period. Therefore, even in a state that plasma does not stabilize immediately after start of the plasma formation, the wafer processing is less likely to be influenced thereby. This contributes to improving the quality of the thin film formed on the wafer 200.

As described above, in the modified example of the third control pattern, the gap between the gas introduction port 241 and the wafer 200 on the substrate placement surface 211, is differentiated depending on the timing of the wafer processing, for example, the gap is differentiated between the certain period immediately after start of the plasma-forming step (S206) and the remaining period after elapse of the certain period.

This modified example shows, for example, a case that in the plasma-forming step (S206), the gap is differentiated between the certain period immediately after start and the remaining period. However, the modified example is not limited thereto. The following control pattern may be used, depending on the timing of the wafer processing. For example, it is conceivable that in the film-forming step of repeating cyclic processing, the gap is differentiated between an initial cycle and a later cycle. In this case, since the gap is controlled so as to be widened at the later cycle, and plasma energy is decreased, an internal stress of a laminated film formed by repeating each cycle can be relaxed.

Further, the control pattern to differentiate the gap depending on the timing of the wafer processing, can be applied to not only the plasma-forming step (S206) but also other steps (S202, S204, S208). For example, the gap may be differentiated between a certain period immediately after start of supplying a gas to the wafer 200 and the remaining period thereof. Even this way, it is possible to contribute to improving the quality of the thin film formed on the wafer 200.

(Fourth Control Pattern)

Next, a fourth control pattern will be described.

Figure 8:
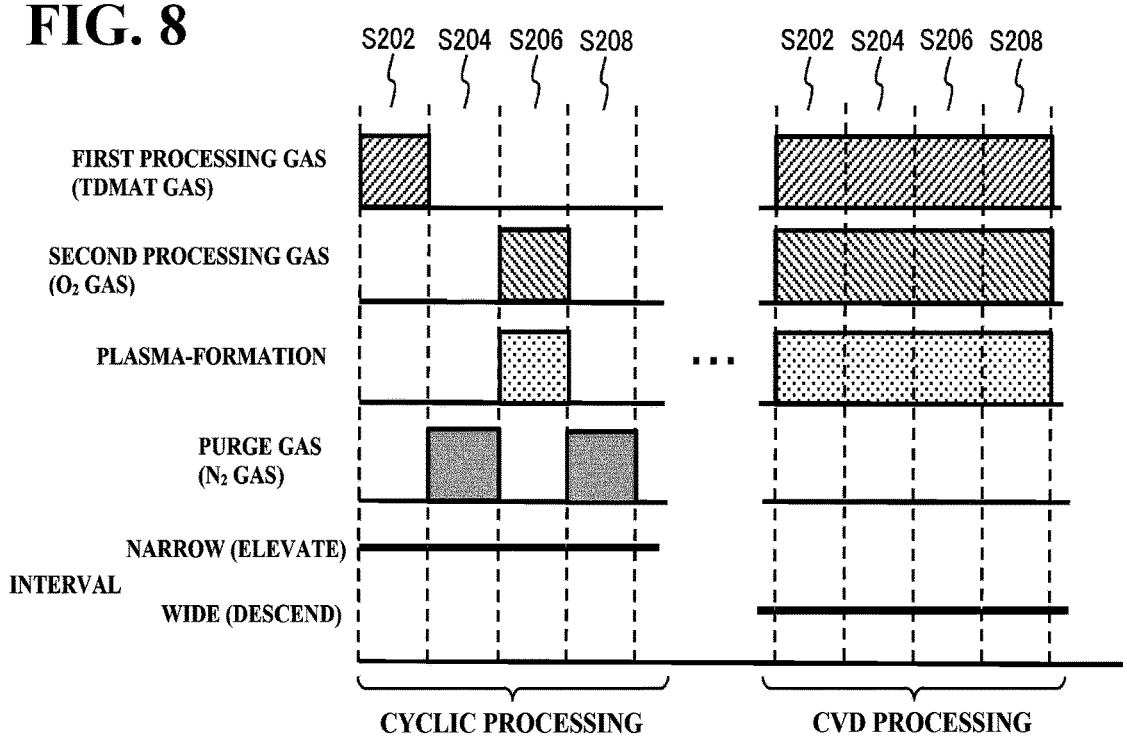
FIG. 8 is a chart showing an example of a fourth control pattern in the film-forming step performed using the substrate processing apparatus according to the first embodiment of this present disclosure.

FIG. 8 is a chart showing an example of the fourth control pattern in the film-forming step performed using the substrate processing apparatus according to the present embodiment.

As illustrated in FIG. 8, in the fourth control pattern, the gap is differentiated between when performing cyclic processing and when performing CVD processing, in a case of performing sequentially the film-forming step of performing cyclic processing and the film-forming step of performing CVD processing.

Specifically, by controlling the elevating operation by the elevating mechanism 218 so that the gap in cyclic processing is narrower than the gap in CVD processing, a dense film can be formed on the wafer 200. On the one hand, by controlling the elevating operation by the elevating mechanism 218 so that the gap in CVD processing is wider than the gap in cyclic processing, a uniform film can be formed quickly on the dense thin film. As a result, the quality of the thin film formed on the wafer 200 can be improved.

As described above, in the fourth control pattern, the gap between the gas introduction port 241 and the wafer 200 on the substrate placement surface 211 is differentiated depending on the content of the wafer processing, for example, the gap is differentiated between when performing cyclic processing and when performing CVD processing.

(Fifth Control Pattern)

Next, a fifth control pattern will be described.

In the fifth control pattern, a size of the gap between the gas introduction port 241 and the wafer 200 on the substrate placement surface 211 is more precisely controlled in any one of the above first control pattern to fourth control pattern. Specifically, the internal pressure of the processing space 201 is monitored by the VG 225, and the controller 260 performs a feed-back control on the elevating operation by the elevating mechanism 218 so as to adjust the size of the gap based on a detection result by the VG 225.

As described above, by performing the feed-back control of the gap size, a pressure state in the processing space 201 is reflected on the gap differentiation control. Namely, the gap differentiation control is performed more precisely. Therefore, the above feed-back control is significantly suitable for improving the quality of the thin film formed on the wafer 200.

(5) Effect Obtained by the Present Embodiment

According to the present embodiment, one or more of the following effects are exhibited.

(a) According to a technique of this present disclosure, the quality of substrate processing (a quality of a film to be formed, for example) can be improved, for example.

(b) According to the present embodiment, in a step of supplying a gas to the wafer 200 on the substrate placement surface 211 from the gas introduction port 241, the elevating operation by the elevating mechanism 218 is controlled so as to differentiate the gap between the gas introduction port 241 and the wafer 200. Therefore, for example, the gas can positively strike the wafer 200, or the gas can be spread over the entire processing space 201, depending on a gap differentiation aspect. As a result, the quality of the wafer processing (specifically, the quality of the film formed on the wafer 200 for example) can be improved.

(c) Particularly, in the present embodiment, the gap is differentiated depending on the timing of the wafer processing, the type of the gas supplied from the gas introduction port 241, or the content of the wafer processing. Therefore, the quality of the thin film formed on the wafer 200 can be reliably improved.

(d) Further, in the present embodiment, the feed-back control is performed on the size of the gap based on the detection result of the internal pressure of the processing space 201. Therefore, the quality of the thin film formed on the wafer 200 can be improved. This is extremely preferable.

Second Embodiment of this Present Disclosure

Next, a second embodiment of this present disclosure will be described. A difference from the above first embodiment will be mainly described here.

Figure 9:
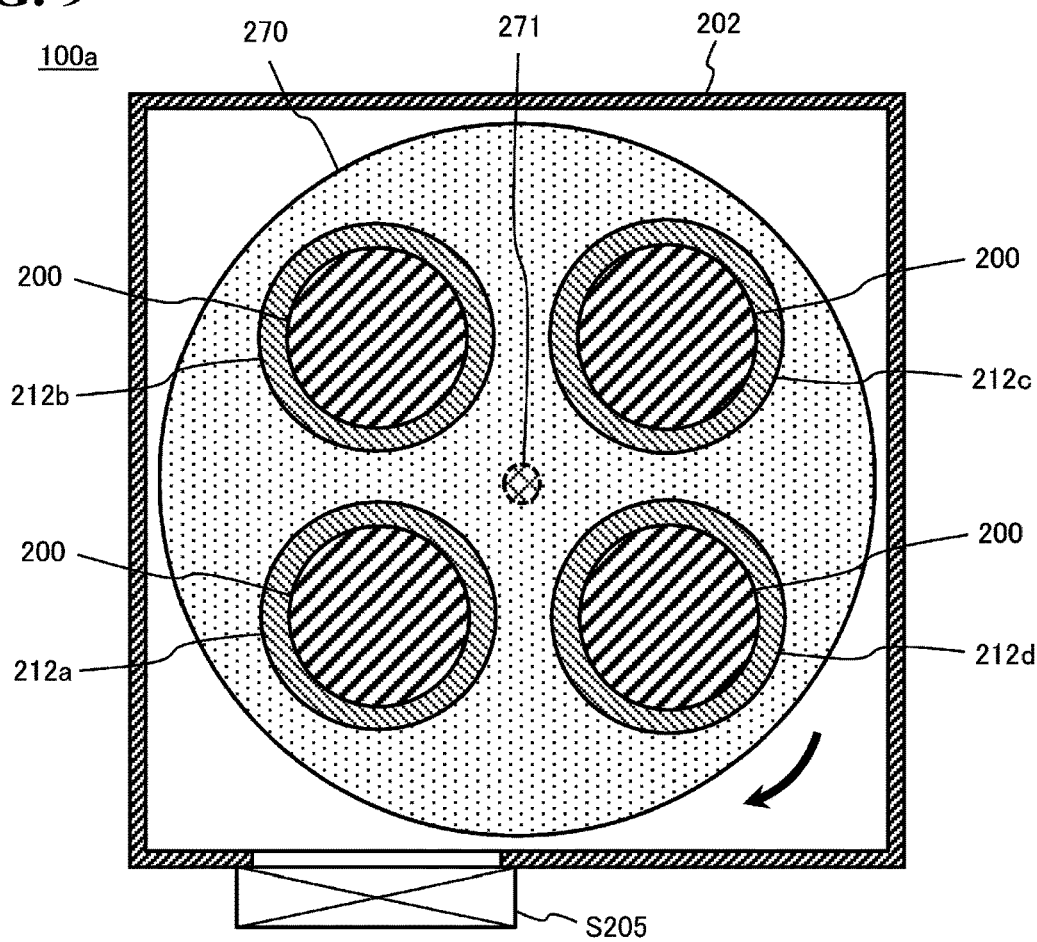
FIG. 9 is a planar view showing schematically a configuration example of a substrate processing apparatus according to a second embodiment of this present disclosure.

FIG. 9 is a planar view showing schematically a configuration example of a substrate processing apparatus according to the second embodiment of this present disclosure.

(Configuration of Apparatus)

As illustrated in FIG. 9, a substrate processing apparatus 100a described in the present embodiment, includes a rotation tray 270 installed in the processing container 202. The rotation tray 270 is configured to be rotatable, with a rotation axis 271 as a center.

A plurality of (for example, four) substrate placement tables 212a, 212b, 212c, and 212d are disposed on the rotation tray 270. All substrate placement tables 212a, 212b, 212c, and 212d have the same configuration as the above first embodiment. Therefore, each of the substrate placement tables 212a, 212b, 212c, and 212d is configured to individually control the elevating operation of the wafer 200. Further, the substrate processing apparatus 100a is configured to individually supply the gas to each substrate placement table. Specifically, the gas introduction ports 241 and the shower heads 230 shown in FIG. 1, are provided to each of the substrate placement tables 212a, 212b, 212c, and 212d. Further, the gas supply system may be configured so that the gas can be supplied to each of the plurality of the gas introduction ports 241, or a common gas supply system may be provided. Furthermore, a plurality of gas exhaust systems may be provided so that the gas supplied to each substrate placement table can be exhausted independently, or a common exhaust system may be provided.

Simultaneous and parallel film-forming step (S104) can be performed to each wafer 200 on each of the substrate placement tables 212a, 212b, 212c, and 212d, using the substrate processing apparatus 100a with such a configuration. More specifically, for example, the wafer processing is realized in such a way that the second processing gas supply step (S206) is performed to a certain wafer 200 while performing the first processing gas supply step (S202) to other wafer 200. Further, for example, the non-plasma forming steps (S202, S204, S208) are performed to a certain wafer 200 while performing the plasma-forming step (S206) to other wafer 200. Furthermore, for example, the wafer processing is realized in such a way that CVD processing is performed to a certain wafer 200 while performing cyclic processing to other wafer 200.

(Control Pattern)

In the substrate processing apparatus 100a with the above configuration as well, the gap between the gas introduction port 241 and the wafer 200 may be differentiated as required, similarly to a case of the above first embodiment. Specifically, for example, when different gases are supplied to different substrate placement tables 212, the gap differentiation control is performed depending on the type of the gas, the supply timing, or the like. Further, when simultaneous and parallel the plasma-forming step and the non-plasma forming step are performed at separate substrate placement tables 212, or when simultaneous and parallel cyclic processing and CVD processing are performed at separate substrate placement tables 212, the gap differentiation control is performed depending on the content of processing to each wafer 200.

(Effect)

In the present embodiment as well, by controlling the elevating operation by the elevating mechanism 218 so as to differentiate the gap between the gas introduction port 241 and the wafer 200, variable as needed, the quality of the wafer processing (the quality of the film to be formed, for example) can be improved.

Other Embodiment

As described above, the first and second embodiments of this present disclosure have been described in detail. However, this present disclosure is not limited to above each embodiment, and can be variously modified in a range not departing from the gist of this present disclosure.

Each embodiment described above mainly shows, for example, a case that in the film-forming step which is one of the substrate processing steps, $TiO_2$ film is formed on the wafer 200 by using TDMAT gas as the first processing gas (the first element-containing gas), and using $O_2$ gas as the second processing gas (the second element-containing gas), and by supplying alternately these gases, however, this present disclosure is not limited thereto. Namely, a processing gas used in film-forming processing is not limited to TDMAT gas, $O_2$ gas, or the like. Other type of the thin film may be formed using other type of the gas. Further, even when three or more types of the gases are used, this present disclosure can be applied as long as the film-forming processing is performed by supplying alternately these gases. Specifically, the first element is not required to be Ti but may be various elements such as Si, Zr, or Hf. Further, the second element is not required to be O but may be N, or the like, for example.

Further, each embodiment described above mainly shows, for example, a case of forming the thin film on the wafer, as the substrate processing step. However, this present disclosure is not limited thereto. Namely, this present disclosure can be applied to the film-forming processing other than the thin film, for example, shown in the above embodiment, in addition to the thin film formation, for example, shown in each embodiment as described above. Further, a specific content of substrate processing is not limited particularly, and this present disclosure can be applied to not only film-forming processing but also other substrate processing such as heat processing (annealing), plasma processing, diffusion processing, oxidizing, nitriding, or lithography processing.

Further, each embodiment described above shows, for example, a case of performing wafer processing as one of manufacturing steps of a semiconductor device. However, this present disclosure is not limited thereto. Namely, a substrate to be processed is not limited to a wafer, and may be a photo-mask, a printed circuit board, a liquid crystal panel, a magnetic disc, an optical disk, or the like.

Preferable Aspects of this Present Disclosure

Preferable aspects of this present disclosure will be supplementarily described hereafter.

[Supplementary Description 1]

According to an aspect of this present disclosure, there is provided a substrate processing apparatus, including:

a process chamber in which a substrate is processed;

a substrate support member configured to support the substrate;

an elevator configured to elevate the substrate support member;

a gas supply port configured to supply a gas to the substrate; and a controller configured to control an elevating operation of the elevator so as to differentiate an interval between the gas supply port and the substrate supported by the substrate support member, when a gas is supplied from the gas supply port.

[Supplementary Description 2]

Preferably, there is provided the substrate processing apparatus according to the supplementary description 1, wherein the controller controls so that the interval is differentiated depending on a timing of substrate processing.

[Supplementary Description 3]

Preferably, there is provided the substrate processing apparatus according to the supplementary description 2, wherein the controller controls so that the interval is differentiated so as to be narrowed in step 1 and so as to be widened in step 2 of two steps.

[Supplementary Description 4]

Preferably, there is provided the substrate processing apparatus according to the supplementary description 2, wherein the controller controls so that the interval is differentiated between a certain period immediately after start of substrate processing and a remaining period after elapse of the certain period.

[Supplementary Description 5]

Preferably, there is provided the substrate processing apparatus according to the supplementary description 1, wherein the controller controls so that the interval is differentiated depending on a type of the gas supplied from the gas supply port.

[Supplementary Description 6]

Preferably, there is provided the substrate processing apparatus according to the supplementary description 5, wherein the controller so that the interval is differentiated so as to be narrowed when a purge gas is supplied.

[Supplementary Description 7]

Preferably, there is provided the substrate processing apparatus according to the supplementary description 5, wherein the controller controls so that the interval is differentiated so as to be narrowed when a first processing gas is supplied and so as to be widened when a second processing gas is supplied.

[Supplementary Description 8]

Preferably, there is provided the substrate processing apparatus according to the supplementary description 1, wherein the controller controls so that the interval is differentiated depending on a content of substrate processing.

[Supplementary Description 9]

Preferably, there is provided the substrate processing apparatus according to the supplementary description 8, including a plasma generation member configured to make a gas supplied to the substrate, in plasma state, wherein the controller controls so that the interval is differentiated between when making plasma state by the plasma generation member and when not making plasma state by the plasma generation member.

[Supplementary Description 10]

Preferably, there is provided the substrate processing apparatus according to the supplementary description 8, wherein the controller controls so that the interval is differentiated between when performing cyclic processing and when performing CVD processing.

[Supplementary Description 11]

Preferably, there is provided the substrate processing apparatus according to any one of the supplementary descriptions 1 to 10, including a detection member configured to detect an internal pressure of the process chamber, wherein the controller is configured to adjust the interval based on a detection result by the detection member.

[Supplementary Description 12]

According to another aspect of this present disclosure, there is provided a method of manufacturing a semiconductor device, including:

processing a substrate by supplying a gas from a gas supply port to the substrate supported by an elevatable substrate support member; and elevating the substrate support member so as to differentiate an interval between the gas supply port and the substrate supported by the substrate support member, when a gas is supplied from the gas supply port.

[Supplementary Description 13]

According to further another aspect of this present disclosure, there is provided a program for causing a substrate processing apparatus to perform by a computer:

a procedure of processing a substrate by supplying a gas from a gas supply port to the substrate supported by an elevatable substrate support member; and a procedure of elevating the substrate support member so as to differentiate an interval between the gas supply port and the substrate supported by the substrate support member, when a gas is supplied from the gas supply port.

[Supplementary Description 14]

According to further another aspect of this present disclosure, there is provided a non-transitory computer-readable recording medium storing a program that causes a substrate processing apparatus to perform by a computer:

a procedure of processing a substrate by supplying a gas from a gas supply port to the substrate supported by an elevatable substrate support member; and a procedure of elevating the substrate support member so as to differentiate an interval between the gas supply port and the substrate supported by the substrate support member, when a gas is supplied from the gas supply port.

What is claimed is:

1. A method of manufacturing a semiconductor device, the method comprising:

processing a substrate by supplying a gas from a gas supply port to the substrate, which is supported by an elevatable substrate support member;

generating plasma of the gas supplied to the substrate; and elevating the substrate support member so as to differentiate (i) an interval between the gas supply port and the substrate immediately after supplying the gas and starting the generation of the plasma from (ii) the interval between the gas supply port and the substrate supported by the substrate support member after elapse of a certain period since starting the generation of the plasma.

2. The method of manufacturing a semiconductor device according to claim 1, wherein, in the elevation of the substrate support member, the interval between the gas supply port and the substrate immediately after starting the generation of the plasma is greater than the interval after the elapse of the certain period.

3. The method of manufacturing a semiconductor device according to claim 1, wherein:

in the processing of the substrate:

a process gas and a reaction gas are supplied as the gas, and a cyclic process is performed, the cyclic process being a process in which a subprocess, in which supply of the process gas and supply of the reaction gas are performed in order, is repeated a plurality of times; and in the generation of the plasma, plasma of the reaction gas is generated as the plasma.

4. The method of manufacturing a semiconductor device according to claim 1, wherein, in the elevation of the substrate support member, the interval is differentiated between a certain period immediately after starting the processing of the substrate and a remaining period after elapse of the certain period.

5. The method of manufacturing a semiconductor device according to claim 1, wherein:

in the processing of the substrate, plural types of gases are sequentially supplied as the gas, and in the elevation of the substrate support member, the interval is differentiated depending on a type of the gas.

6. The method of manufacturing a semiconductor device according to claim 1, wherein in the elevation of the substrate support member, the interval is different between when generating the plasma and when not generating the plasma.

7. The method of manufacturing a semiconductor device according to claim 1, wherein, in the elevation of the substrate support member, the interval is adjusted according to an internal pressure of a process chamber in which the substrate is processed.

8. The method of manufacturing a semiconductor device according to claim 2, wherein, in the processing of the substrate:

a process gas and a reaction gas are supplied as the gas, and a cyclic process is performed, the cyclic process being a process in which a subprocess, in which a supply of the process gas and a supply of the reaction gas are performed in order, is repeated a plurality of times; and in the generation of the plasma, plasma of the reaction gas is generated as the plasma.

9. The method of manufacturing a semiconductor device according to claim 2, wherein, in the elevation of the substrate support member, the interval is differentiated between a certain period immediately after starting of the processing of the substrate and a remaining period after elapse of the certain period.

10. The method of manufacturing a semiconductor device according to claim 3, wherein, in the elevation of the substrate support member, the interval is differentiated between a certain period immediately after starting the processing of the substrate and a remaining period after elapse of the certain period.

11. The method of manufacturing a semiconductor device according to claim 3, wherein the supply of the gas in the processing of the substrate and the elevation process of the substrate support member in the elevation of the substrate support member are controlled so as to differentiate the interval between the gas supply port and the substrate during an initial cycle in the cyclic process from the interval between the gas supply port and the substrate during a late cycle in the cyclic process.

12. The method of manufacturing a semiconductor device according to claim 3, wherein the supply of the gas in the processing of the substrate and the elevation process of the substrate support member in the elevation of the substrate support member are controlled such that the interval between the gas supply port and the substrate during an initial cycle in the cyclic process is smaller than the interval between the gas supply port and the substrate during a late cycle in the cyclic process.

13. The method of manufacturing a semiconductor device according to claim 2, wherein:
   in the processing of the substrate, plural types of gases are supplied in order as the gas; and
   in the elevation of the substrate support member, the interval is differentiated depending on a type of the gas.

14. The method of manufacturing a semiconductor device according to claim 3, wherein:
   in the processing of the substrate, plural types of gases are supplied in order as the gas; and
   in the elevation of the substrate support member, the interval is differentiated depending on a type of the gas.

15. The method of manufacturing a semiconductor device according to claim 4, wherein:
   in the processing of the substrate, plural types of gases are supplied in order as the gas; and
   in the elevation of the substrate support member, the interval is differentiated depending on a type of the gas.

16. The method of manufacturing a semiconductor device according to claim 2, wherein, in the elevation of the substrate support member, the interval is differentiated between when generating the plasma and when not generating the plasma.

17. The method of manufacturing a semiconductor device according to claim 3, wherein, in the elevation of the substrate support member, the interval is differentiated between when generating the plasma and when not generating the plasma.

18. The method of manufacturing a semiconductor device according to claim 2, wherein, in the elevation of the substrate support member, the interval is adjusted according to an internal pressure of a process chamber in which the substrate is processed.

19. The method of manufacturing a semiconductor device according to claim 3, wherein, in the elevation of the substrate support member, the interval is adjusted according to an internal pressure of a process chamber in which the substrate is processed.

20. The method of manufacturing a semiconductor device according to claim 4, wherein, in the elevation of the substrate support member, the interval is adjusted according to an internal pressure of a process chamber in which the substrate is processed.

* * * * *